(12) United States Patent
Timm, IV

(10) Patent No.: US 7,800,435 B2
(45) Date of Patent: Sep. 21, 2010

(54) AUDIO FILTER USING A DIODE CONNECTED MOSFET

(75) Inventor: Frederick N. Timm, IV, Carlsbad, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/609,009

(22) Filed: Dec. 11, 2006

(65) Prior Publication Data

US 2008/0136509 A1  Jun. 12, 2008

(51) Int. Cl.
*H03K 5/00* (2006.01)
(52) U.S. Cl. .................................... 327/558
(58) Field of Classification Search ............... 327/311, 327/532, 551–559, 336–337
See application file for complete search history.

(56) References Cited

U.S. PATENT DOCUMENTS

| | | | | |
|---|---|---|---|---|
| 5,008,565 A | * | 4/1991 | Taylor | 327/543 |
| 5,627,736 A | * | 5/1997 | Taylor | 363/39 |
| 6,677,834 B1 | * | 1/2004 | Rafalczik et al. | 333/181 |
| 6,897,528 B2 | | 5/2005 | Al-Sarawi | |
| 7,180,383 B2 | * | 2/2007 | Angel et al. | 331/177 V |

FOREIGN PATENT DOCUMENTS

JP  02005142924 A  *  6/2005

OTHER PUBLICATIONS

Schmit, Hanspeter et al., A 8.25-MHz 7th-order Bessel filter built with MOSFET-C single-amplifier biquads, Analog Intergrated Circuits and Signal Processing, Jan. 2002, pp. 69-81, vol. 30, No. 1.
Lee, Tsung-Sum et al., Two MOSFET-C Low-Voltage Fully Differential Voltage-Controlled Oscillators for Frequency Tuning, 2002 IEEE Asia-Pacific Conference On ASIC Proceedings, Aug. 2002.
Yoshizawa, Atsushi, Esscirc 2002 Advance Program, Sep. 2002, Session C-36-Filters, IEMN-ISEN, France.
Xiong, Zhijie, Radio Frequency Low Noise and High Q Integrated Filters in Digital CMOS Processes, A Thesis Presented to the Academic Faculty of Georgia Institute of Technology, Jul. 2004.
Egan, Patrick et al., Direct read-out CMOS camera with applications to full-field optical coherence tomography, SPIE Europe Conference on Imaging and Vision Proceedings of the SPIE, Apr. 2005, vol. 5823.

* cited by examiner

*Primary Examiner*—Dinh T. Le
(74) *Attorney, Agent, or Firm*—Cesari and McKenna, LLP; Edwin H. Paul, Esq.

(57) ABSTRACT

A diode connected P-type CMOS transistor is operated in the sub-threshold area and, with a bypass capacitor, operates as a low pass audio filter. The equivalent resistance of the CMOS transistor in the sub-threshold range is very high—in the gigaOhm range. With this size resistor, a capacitor in the 1-25 pF range may be used to provide filtering capabilities with break points in the 1-10 Hz frequency range. Such a filter provides an effective low pass filter that attenuates audio frequency signals. The 1-25 pF capacitors use little chip area making the arrangement practical for integrating on an IC with the audio signals. In one embodiment, a digital signal and the audio signals share one pin, where the audio signal appears only when the digital signal is high. In this case, the audio signal filtered out from the digital high signal. The filtered digital signal drives digital circuitry while the audio signal is directed to other audio circuitry.

3 Claims, 1 Drawing Sheet

AUDIO FILTER USING A DIODE CONNECTED MOSFET

BACKGROUND OF THE INVENTION

1. Field of the Invention

The present invention relates to low pass electronic filters using high value resistors and capacitors suitable for fabricating on a silicon IC (Integrated Circuit), and more particularly to a low pass filter that attenuates the audio frequency range, but is efficient in its use of chip area.

2. Background Information

Audio frequency electronic components typically require high value capacitors that are unsuited for placing in silicon ICs since the chip area needed is large. Large resistors may be more easily obtained in silicon, but large value capacitors are very inefficient with respect to chip area. For example a 0.1 microFarad capacitor may use as much as $4\times10^7$ square microns or (40 square millimeters) of chip area. The audio range is defined herein to extend from about 20 Hz (Hertz) to 10K Hz.

In some audio systems, digital (logic) circuits are integrated onto the same chip. One issue with these audio systems is that the audio signals might find their way into the logic circuitry where errors may result. For example as in FIG. 1, if a digital circuit component, say a N-type CMOS 2 finds an audio signal riding on a typical DC voltage of +1.3V at its gate A, the low going portion of the audio signal may reach the gate threshold and erroneously turn CMOS off. However, if A was at a DC level of +1.3 V, the CMOS 2 threshold was at 0.7V, and the audio signal had a negative peak voltage of say 0.7V, point A would drop (1.3V-0.7V) to +0.6V which would turn off the CMOS 2. The result is that the output B would go high when it should not do so. The present invention is directed to relieving such a problem.

As mentioned above, fabricating audio frequency range components, large resistors and large capacitors, on silicon chips is a problem that others addressed. U.S. Pat. No. 6,897,528 B2, to Said Al-Sarawi (hereinafter '528 patent) is one example. This patent discloses a very high value floating CMOS resistor in the gigaOhms range that can be combined with small capacitors to form components useful in the audio frequency range. The '528 patent's high value resistors allows the capacitors to be small enough to make audio IC circuitry practical.

The '528 patent, however, uses a dual balanced combination of CMOS devices to achieve the "floating" characteristic. The "floating" allows the resistor to be fairly unrestricted with respect to ground or power supplies, however, the '528 patent invention requires a constant DC power drain and more chip area (due to its dual nature) as compared to the present invention.

SUMMARY OF THE INVENTION

The present invention provides for a system that filters audio signals at the silicon IC level so that the audio signals will not interfere with the digital circuitry operations. The present invention does not have a constant power drain and uses less chip area than components made in accordance with the '528 patent.

A diode connected transistor, in one embodiment a diode connected P-type CMOS, provides a high value resistance that is placed in series with a conductor carrying a digital signal to a control input of a digital gate. A capacitor is formed from that control input to a low impedance signal return. The values of equivalent resistance of the diode connected transistor and the capacitor are, in one embodiment, arranged to provide a low pass filter with a break frequency of about one (1) Hz. Such a filter will significantly attenuate any audio signal. In the present invention, the size of the capacitor can be made small enough to be fabricated on an IC.

The CMOS is operated in the sub-threshold range to achieve the highest resistance, and the audio signal is attenuated so as to not interfere with the subsequent digital circuitry.

In one embodiment, a single pin is used to carry both the audio signal and a digital signal. However, the audio signal is only present when the digital signal is high. In such a circuit, the dynamic range of the audio signal must not cause the digital signal to be mistaken for a digital low. The audio signal is directed to other audio circuitry.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
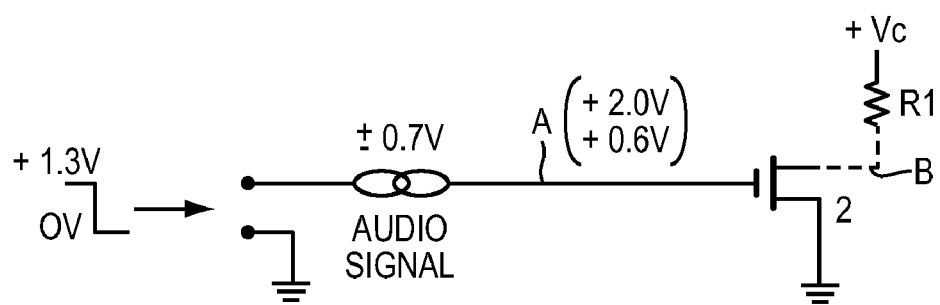
FIG. 1 is a circuit diagram illustrating a digital component operating with audio frequency signals.
Figure 2A:
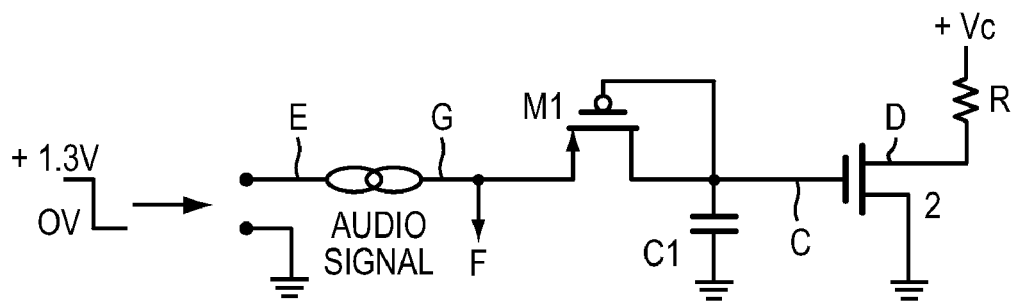
FIG. 2A is a circuit embodiment illustrating the present invention.

FIG. 2A adds a series P-type CMOS, M1, and a bypass capacitor C1 to the circuit of FIG. 1. The source of M1 is at a typical DC +1.3V level and a possible interfering audio signal is shown. The design provides that M1 and C1 attenuates the audio signal so that the N-type CMOS 2 does not turn off during the negative peak of the audio signal, as it did in FIG. 1 discussed above.

Figure 3:
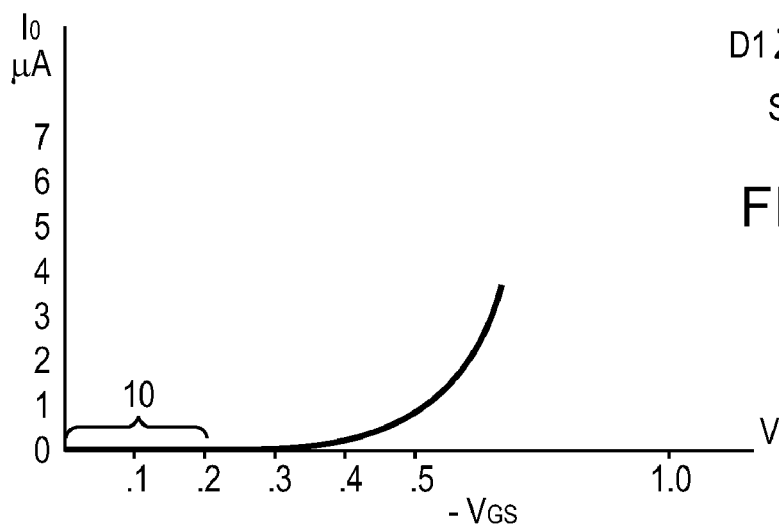
FIG. 3 is a voltage/current graph of a diode connected CMOS in the sub-threshold range.

Referring to FIG. 2A, if the gate input C is at 0V, M1 is connected as a diode, as point E rises to the +1.3 volt level, current will flow through the diode (M1) and charge C1. As C1 charges, the voltage across M1 will decrease until it is in the sub-threshold range. At this point, as shown in FIG. 3, some microAmp current will continue to charge C1 until the voltage across M1 is in the 0.1-0.2 V range. At a Vgs of 0.2V, the equivalent resistance of M1 is a very high value (in the gigaOhms), and point C might remain at about 1.0 to 1.1V. The CMOS 2 will be on, assuming its threshold is about 0.7V, and drive point D low.

M1 is biased in the sub-threshold range, item 10 in FIG. 3, and effects a 100 gigaOhm value and C1 is 1 pF. This combination is efficient of chip area, but other values for the equivalent resistance (R) of M1 and C1 may be used in other applications. The RC combination will have a one pole roll off at a break frequency of about 1.5 Hertz. So at 15 Hz, the attenuation will be about 20 db (1/10) and about 40 db (1/100) at 150 Hz. Clearly audio signals from 20 to 2000 hertz will be significantly attenuated. Therefore, in gross terms, the negative going audio signal with a peak of 0.7V will be reduced to about 0.07V and the gate of CMOS 2 will be reduced from about 1.0 to 0.93V. CMOS 2 will remain on. Note that when the audio signal is going low, the resistance of M1 is increasing (since Vgs is being reduced) so the filtering effect of M1 and C1 is increased, thereby increasing the margin by which C remains above the CMOS 2's threshold.

When the audio signal goes high, point C will finally rise to the diode threshold and then follow the input, less the diode threshold (voltage drop) of M1, but the effect is simply to keep CMOS 2 on.

M1 connected as a diode, where the drain current plotted against gate (drain) to source voltage demonstrates a logarithmic function. That is, the source to gate voltage is a function of the log of the drain current. This relationship is generally true for gate to source voltages in the sub-threshold range, as shown in FIG. 3, where the transistor is always saturated. Above the threshold, the diode connected CMOS transistors generally follow a square law relationship of drain current to gate to source voltages, but for the present invention this operation is acceptable.

Figure 2B:
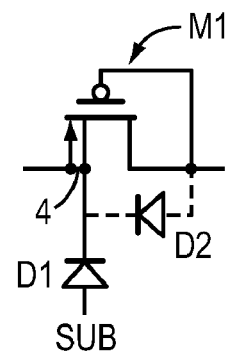
FIG. 2B shows the connections to a P-type MOS.

Referring to FIG. 2B a detail of the P-type CMOS M1 is shown. There is a substrate layer that forms a diode D1 from the substrate to the bulk layer of the transistor. In addition, there is a connection 4 from the bulk to the source of the transistor. In this arrangement there is a diode D2 from the drain to the source. When the digital signal at E goes to ground, D1 forward biases (if C1 was charged up to 0.7V or so) and pulls the gate of transistor 2 toward ground, turning it off. The threshold of D1 will quickly discharge C1, and keep the gate well below the threshold of transistor 2. In a preferred embodiment, the audio signal is turned off before point E goes to ground.

In one embodiment, the point G may be a single pin on a chip that has a dual use. Both the high digital signal and the audio signal are meant to occur on this pin, thereby saving a pin. In such a case, the audio signal is sent to other locations, F, for use by other audio circuitry. In this embodiment, the audio is removed before the digital signal drives to ground and the digital low signal does not have the audio signal riding on it.

The net effect is that the combination of M1 and C1 filters the audio signal from the digital high signal and prevents its affecting the operation of the CMOS 2.

The above embodiments of the present invention describes a P-type CMOS transistor. However, as would be known to those skilled in the art, other components from other processes, e.g. NMOS, PMOS, etc., may be used to advantage.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. In an integrated circuit chip containing an audio system and a digital logic circuit, the digital logic circuit comprising:
    an input terminal receiving an input signal comprising a digital signal and an audio frequency signal;
    an output transistor arranged as a digital inverter with a control gate and a drain connected to an output and to a resistor;
    a digital signal connected between the first end of the audio frequency signal and ground;
    a low pass audio frequency filter connected between the input terminal and the control gate, the low pass audio frequency filter comprising:
    a diode connected transistor arranged to be operated in the sub-threshold range;
    a capacitor coupled between the control gate and a ground return; and wherein said low pass audio frequency filter attenuates the audio frequency signal to not turn off the output transistor.

2. The digital logic circuit of claim 1 wherein the capacitor's value is in the range from less than one to twenty five pF.

3. The digital logic circuit of claim 1 wherein the filter is a low pass filter with a break frequency in the range of less than one to ten Hz.

\* \* \* \* \*